(12) United States Patent
Cao et al.

(10) Patent No.: US 8,635,579 B1
(45) Date of Patent: Jan. 21, 2014

(54) LOCAL CLOCK SKEW OPTIMIZATION

(71) Applicant: Synopsys, Inc., Mountain View, CA (US)

(72) Inventors: Aiqun Cao, Mountain View, CA (US); Ssu-Min Chang, Mountain View, CA (US); Dah-Cherng Yuan, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/732,194

(22) Filed: Dec. 31, 2012

(51) Int. Cl.
*G06F 17/50* (2006.01)

(52) U.S. Cl.
USPC ............ 716/134; 716/105; 716/108; 716/125

(58) Field of Classification Search
USPC .................................. 716/105, 108, 125, 134
See application file for complete search history.

(56) References Cited

U.S. PATENT DOCUMENTS

| | | | |
|---|---|---|---|
| 6,539,536 B1 * | 3/2003 | Singh et al. ................... | 716/102 |
| 6,560,763 B1 * | 5/2003 | Sugiyama et al. ............. | 716/113 |
| 6,701,507 B1 * | 3/2004 | Srinivasan .................... | 716/114 |
| 6,748,573 B2 * | 6/2004 | Baumgartner et al. ....... | 716/106 |
| 6,799,308 B2 * | 9/2004 | You et al. ...................... | 716/113 |
| 7,546,567 B2 * | 6/2009 | Cheon et al. .................. | 716/113 |
| 7,624,364 B2 * | 11/2009 | Albrecht et al. .............. | 716/113 |
| 7,653,884 B2 * | 1/2010 | Furnish et al. ................ | 716/103 |
| 7,791,394 B2 * | 9/2010 | Schmid et al. ................ | 327/295 |
| 7,814,451 B2 * | 10/2010 | Furnish et al. ................ | 716/100 |
| 7,987,382 B2 * | 7/2011 | Badaroglu .................... | 713/500 |
| 7,987,440 B2 * | 7/2011 | Kalafala et al. ............... | 716/108 |
| 8,205,182 B1 * | 6/2012 | Zlatanovici et al. .......... | 716/125 |
| 2004/0123259 A1 * | 6/2004 | You et al. .......................... | 716/6 |
| 2012/0047478 A1 * | 2/2012 | Ge et al. ........................ | 716/108 |
| 2012/0304136 A1 * | 11/2012 | Ge et al. ........................ | 716/108 |

* cited by examiner

*Primary Examiner* — Naum Levin
(74) *Attorney, Agent, or Firm* — Park, Vaughan, Fleming & Dowler LLP; Laxman Sahasrabuddhe

(57) ABSTRACT

Methods and apparatuses are described for optimizing local clock skew, and/or for synthesizing clock trees in an incremental fashion. For optimizing local clock skew, the circuit design can be partitioned into clock skew groups. Next, for each clock skew group, an initial clock tree can be constructed that substantially minimizes worst case clock skew in the clock skew group, and then the initial clock tree can be further optimized by substantially minimizing worst case local clock skew in the clock skew group. For performing incremental clock tree synthesis, a portion of a clock tree in the circuit design can be selected based on a set of modifications to the circuit design. Next, a new clock tree can be determined to replace the selected portion of the clock tree. The circuit design can then be modified by replacing the selected portion of the clock tree with the new clock tree.

12 Claims, 9 Drawing Sheets

LOCAL CLOCK SKEW OPTIMIZATION

BACKGROUND

1. Technical Field

This disclosure relates to electronic design automation (EDA). More specifically, this disclosure relates to local clock skew optimization and incremental clock tree synthesis.

2. Related Art

Clock tree synthesis refers to the process of creating a clock distribution network for distributing a clock signal to a set of sequential circuit elements in a circuit design. A circuit design may include multiple clock domains, and each clock domain can include multiple clock trees. The quality of the clock trees that are generated by clock tree synthesis can have a significant impact on downstream stages in the EDA flow, especially on timing closure. Hence, what are needed are systems and techniques for clock tree synthesis that can efficiently create high quality clock trees.

SUMMARY

Some embodiments described herein provide systems and techniques for optimizing local clock skew during clock tree synthesis, and/or for synthesizing clock trees in an incremental fashion.

Specifically, some embodiments optimize local clock skew as follows. An embodiment can partition the circuit design into clock skew groups based on direct and transitive timing relationships between sequential circuit elements in the circuit design. Next, for each clock skew group, the embodiment can build an initial clock tree that substantially minimizes worst case clock skew in the clock skew group, and then optimize the initial clock tree by substantially minimizing worst case local clock skew in the clock skew group. All pairs of sequential circuit elements in a clock skew group have a direct or a transitive timing relationship between each other, and two sequential circuit elements in two different clock skew groups do not have a direct or a transitive timing relationship between each other. Further, the worst case clock skew in the clock skew group is computed over all pairs of sequential circuit elements in the clock skew group, and the worst case local clock skew in the clock skew group is computed over all pairs of sequential circuit elements in the clock skew group that have a direct timing relationship between each other. In some embodiments, after the clock tree has been synthesized, the embodiment can report (either automatically or in response to user input) the worst case local clock skew for each clock skew group.

Some embodiments can incrementally synthesize a clock tree as follows. A modification on a circuit design may be performed (either manually by a user or automatically by an EDA tool) to obtain a modified circuit design. For example, the circuit design may be modified when one or more engineering change orders (ECOs) are applied to the circuit design. As another example, circuit design may be modified when a logical and/or physical synthesis tool modifies the circuit design (e.g., while performing timing, area, and/or leakage power optimization on the circuit design). In response to receiving user input or detecting that a modification was performed on the circuit design, an embodiment can select a portion of a clock tree in the circuit design based on the modification to the circuit design. Next, the embodiment can determine a new clock tree to replace the selected portion of the clock tree. In some embodiments, the new clock tree can be determined by extending the existing clock tree to accommodate the modifications to the circuit design. In other embodiments, the new clock tree can be determined by ripping up the selected portion of the clock tree, and rebuilding only the ripped-up portion of the cock tree. The embodiment can then modify the modified circuit design by replacing the selected portion of the clock tree with the new clock tree.

DETAILED DESCRIPTION

Figure 1:
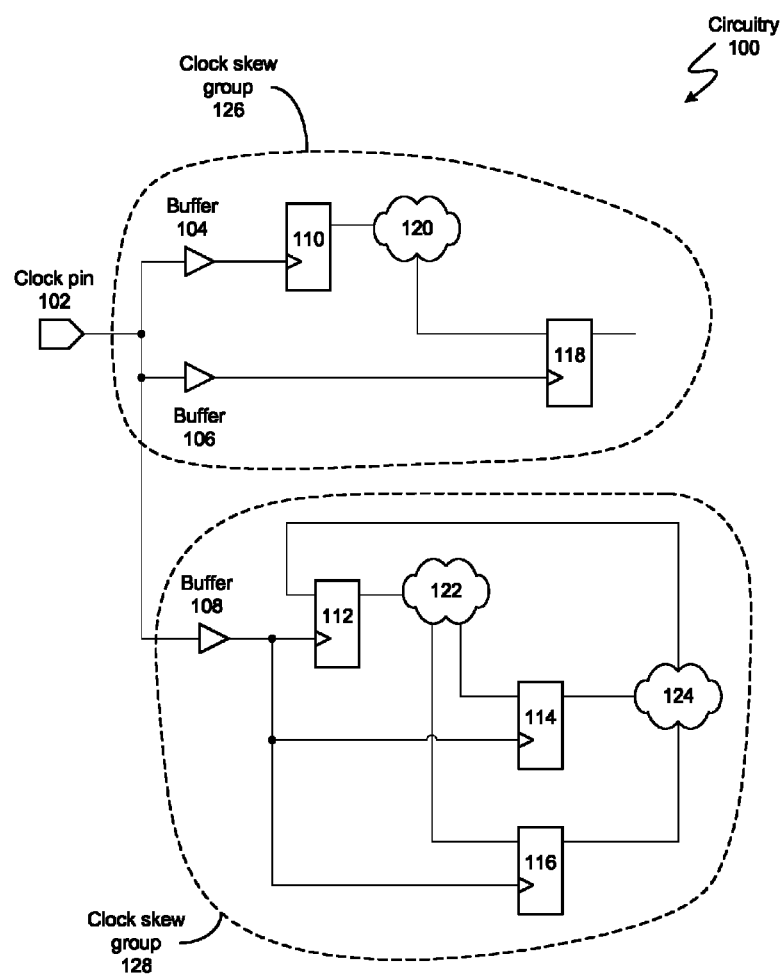
FIG. 1 illustrates circuitry that includes two clock skew groups in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Local Clock Skew Optimization

Some conventional techniques try to minimize global clock skew over the entire circuit design. Such global-clock-skew-based approaches may fail to generate a clock tree that satisfies all of the timing, area, and leakage power constraints. Even if a suitable clock tree is successfully generated, the quality of the clock tree may be poor, which can make it difficult to achieve timing closure. In contrast to conventional approaches, some embodiments described herein minimize local clock skew, which can make it significantly easier to satisfy the various constraints and to achieve timing closure.

A clock skew group includes sequential circuit elements that have a direct and/or a transitive timing relationship between one another. FIG. 1 illustrates circuitry that includes two clock skew groups in accordance with some embodiments described herein. Circuitry 100 includes buffers 104-108, sequential circuit elements 110-118, and combinational logic clouds 120-124. A clock signal is distributed from clock pin 102 to sequential circuit elements 110-118 via a clock tree that includes buffers 104-108. A sequential circuit element is generally any element that performs an operation based on a clock signal. For example, a flip-flop is a sequential circuit element. A combinational logic cloud includes one or more combinational logic gates (e.g., AND gates, OR gates, NOT gates, XOR gates, multiplexers, demultiplexers, buffers, repeaters, etc.), but does not include any sequential circuit elements.

A direct timing relationship exists between two sequential circuit elements if one sequential circuit element launches a signal and the other captures the signal (the signal may optionally pass through a combinational logic cloud before being captured). For example, sequential circuit element 110 launches a signal that passes through combinational logic cloud 120 (which may logically combine the signal with other signals) and then is captured by sequential circuit element 118. Therefore, sequential circuit elements 110 and 118 have a direct timing relationship.

A transitive timing relationship exists between sequential circuit elements $F_1$ and $F_N$ if and only if a series of sequential circuit elements $F_1, F_2, \ldots, F_{N-1}, F_N$ exists such that a direct timing relationship exists between every pair of neighboring sequential circuit elements in the series (i.e., a direct timing relationship exists between sequential circuit elements $F_i$ and $F_{i+1}$, where $1 \leq i \leq N-1$). For example, a direct timing relationship exists between sequential circuit elements 114 and 112 (because sequential circuit element 114 launches a signal that passes through combination logic block 124 and is captured by sequential circuit element 112), and a direct timing relationship exists between sequential circuit elements 112 and 116 (because sequential circuit element 112 launches a signal that passes through combination logic block 122 and is captured by sequential circuit element 116). Therefore, a transitive timing relationship exists between sequential circuit elements 114 and 116. Note that a direct and a transitive timing relationship may exist between two sequential circuit elements.

A clock skew group is a group of circuit elements such that all pairs of sequential circuit elements in the clock skew group have a direct and/or a transitive timing relationship between each other. Note that two sequential circuit elements in two different clock skew groups do not have a direct or a transitive timing relationship between each other. For example, circuit 100 includes clock skew groups 126 and 128. Clock skew group 126 includes sequential circuit elements 110 and 118, and clock skew group 128 includes sequential circuit elements 112-116. Note that a sequential circuit element (e.g., sequential circuit element 110) in clock skew group 126 does not have a direct or a transitive timing relationship with any of the sequential circuit elements (e.g., sequential circuit elements 112-116) in clock skew group 128.

Figure 2:
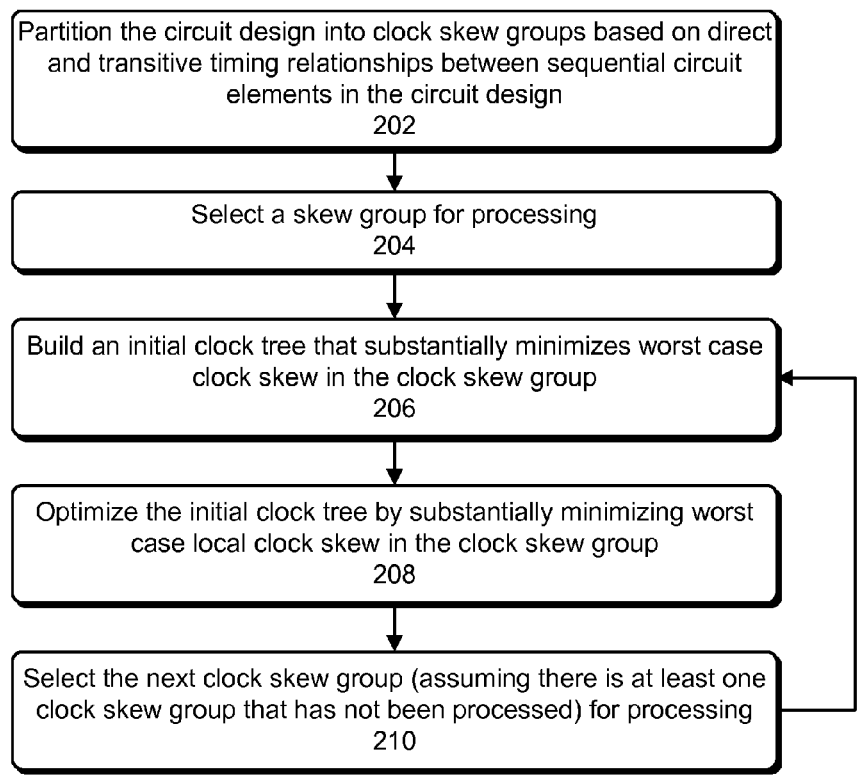
FIG. 2 presents a flowchart that illustrates a process for clock tree synthesis that optimizes local clock skew in accordance with some embodiments described herein.

FIG. 2 presents a flowchart that illustrates a process for clock tree synthesis that optimizes local clock skew in accordance with some embodiments described herein. The process can begin with partitioning the circuit design into clock skew groups based on direct and transitive timing relationships between sequential circuit elements in the circuit design (operation 202). For example, each sequential circuit element in the circuit design can be represented by a vertex in a graph, and an edge can be created between two vertices if the corresponding sequential circuit elements have a direct or a transitive timing relationship. Note that a connected component in the graph corresponds to a clock skew group. Therefore, clock skew groups can be determined by determining the connected components in the graph.

Once the clock skew groups have been determined, a clock tree can be synthesized for each clock skew group. Specifically, a skew group can be selected for processing (operation 204). Next, an initial clock tree that substantially minimizes worst case clock skew in the clock skew group can be built (operation 206). According to one definition, the worst case clock skew in a clock skew group is the maximum clock skew between any two sequential circuit elements in the clock skew group. In other words, the worst case clock skew in the clock skew group is computed over all pairs of sequential circuit elements in the clock skew group. For example, suppose the delays from clock pin 102 to the clock inputs of sequential circuit elements 112, 114, and 116 are 2.0 ns, 1.8 ns, and 2.2 ns. Then, the worst case clock skew in clock skew group 128 will be the clock skew between sequential circuit elements 114 and 116, i.e., 2.2 ns-1.8 ns=0.4 ns. In some embodiments, the worst case clock skew can be substantially minimized by iteratively reducing the worst case clock skew. For example, in each iteration, the process can identify the pair of sequential circuit elements that have the worst case clock skew, and then the process can try to increase the delay to the sequential circuit element that is receiving the clock signal early and/or by decreasing the delay to the sequential circuit element that is receiving the clock signal late. The iterative process can be terminated when the worst case clock skew is less than a predetermined clock skew tolerance and/or a predetermined number of iterations have been performed.

Once the initial clock tree is determined, the initial clock tree can then be optimized by substantially minimizing local clock skew between sequential circuit elements in the clock skew group that have a direct timing relationship (operation 208). In some embodiments, the local clock skew can be substantially minimized by iteratively reducing the worst case local clock skew. For example, in each iteration, the process can identify the pair of sequential circuit elements that have the worst case local clock skew, and then the process can try to increase the delay to the sequential circuit element that is receiving the clock signal early and/or by decreasing the delay to the sequential circuit element that is receiving the clock signal late. The iterative process can be terminated when the worst case local clock skew is less than a predetermined local clock skew tolerance and/or a predetermined number of iterations have been performed.

Note that the worst case local clock skew in the clock skew group is computed over all pairs of sequential circuit elements in the clock skew group that have a direct timing relationship between each other. For example, suppose the delays from clock pin 102 to the clock inputs of sequential circuit elements 112, 114, and 116 are 2.0 ns, 1.8 ns, and 2.2 ns. Then, the worst case local clock skew in clock skew group 128 will be the maximum of the clock skew between sequential circuit elements 112 and 114 and the clock skew between sequential circuit elements 112 and 116. In other words, the worst case local clock skew in clock skew group 128 will be 0.2 ns in this example (note that this is less than the 0.4 ns worst case clock skew that was computed above). Note that the clock skew between sequential circuit elements 112 and 114 is not considered during the worst case local clock skew computation because sequential circuit elements 112 and 114 do not have a direct timing relationship.

The process can then select the next clock skew group (assuming there is at least one clock skew group that has not been processed) for processing (operation 210), and return to operation 206. Some embodiments can report the worst case local clock skew for each clock skew group. Specifically, the user can request that the clock tree synthesis tool report one or more of the following: (1) the worst case global clock skew across the entire circuit design, (2) the worst case local clock skew across all clock skew groups, and/or (3) the worst case local clock skew for each clock skew group (e.g., in a tabular format in which one of the columns has the clock skew group identifier and another column has the worst case local clock skew).

Figure 3:
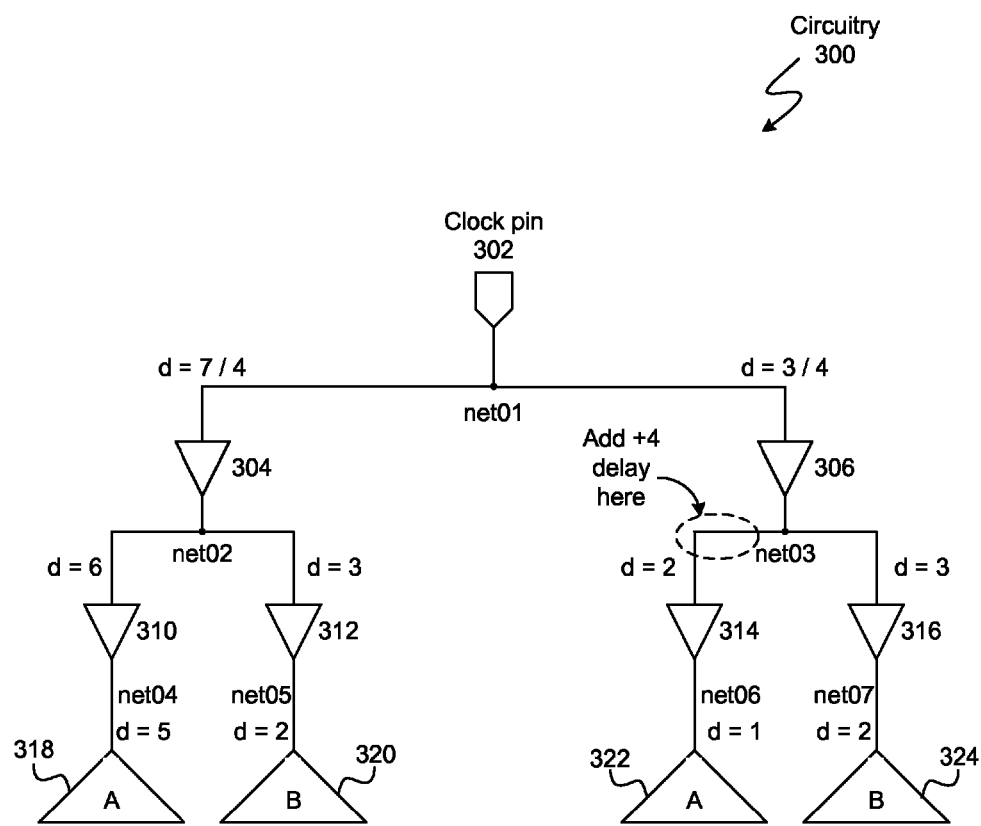
FIG. 3 illustrates an example of substantially minimizing local clock skew in accordance with some embodiments described herein.

FIG. 3 illustrates an example of substantially minimizing local clock skew in accordance with some embodiments described herein. Circuitry 300 includes a clock tree that distributes a clock signal from clock pin 302 to a set of sequential circuit elements in a circuit design. The clock tree includes nets net01-net07, buffers 304-316, and clock sub-trees 318-324. Each buffer in FIG. 3 is assumed to have a delay of 1 unit.

Let us assume that the circuit design is partitioned into two clock skew groups A and B. Clock sub-trees 318 and 322 belong to clock skew group A, and clock sub-trees 320 and 324 belong to clock skew group B. The notation "d=n," where n is a number, indicates the delay from that point to the furthest (i.e., furthest in terms of delay) downstream clock input pin. For example, the text "d=5" is shown near net04 in FIG. 3. This indicates that the delay from net04 to the furthest clock input pin in clock sub-tree 318 is equal to 5. The notation "d=m/n," where m and n are numbers, indicates that delay from that point to the furthest downstream clock input pins in clock skew groups A and B, respectively. For example, the text "d=7/4" is shown at the input of buffer 304. This indicates that the delay from the input of buffer 304 to the furthest downstream pin in clock skew group A (i.e., in clock sub-tree 318) is equal to 7, and the delay from the input of buffer 304 to the furthest downstream pin in clock skew group B (i.e., in clock sub-tree 320) is equal to 4.

In clock skew group B, the maximum delay from clock pin 302 to a clock input pin on the left branch (i.e., through buffer 304) is equal to 4, which is the same as the maximum delay from clock pin 302 to a clock input pin on the right branch (i.e., through buffer 306). In other words, as far as clock skew group B is concerned, the clock tree shown in FIG. 3 is balanced. A balanced clock tree is desirable, and so we would not want to make changes to the clock tree shown in FIG. 3 that would unbalance the clock tree for clock skew group B.

In clock skew group A, on the other hand, the maximum delay from clock pin 302 to a clock input pin on the left branch (i.e., through buffer 304) is equal to 7, and the maximum delay from clock pin 302 to a clock input pin on the right branch (i.e., through buffer 306) is equal to 3. Therefore, the clock tree is not balanced if we consider clock skew group A.

An advantage of the local clock skew optimization systems and techniques described herein is that these approaches can balance the clock tree for a particular clock skew group without disturbing the balance characteristics of other clock trees for other clock skew groups. Specifically, in the example shown in FIG. 3, we would like to balance the clock tree for clock skew group A without disturbing the balanced clock tree for clock skew group B. This can be achieved by adding a delay of +4 between the output of buffer 306 and the input of buffer 314 as shown in FIG. 3. Note that, if we were to add that delay, then the clock tree will be balanced for both clock skew groups. Balancing clock trees of individual clock skew groups in this manner is not possible in conventional global-clock-skew-based approaches.

Incremental Clock Tree Synthesis

Some conventional clock tree synthesis approaches construct a clock tree from scratch whenever the clock tree synthesis process is invoked. Such approaches have a number of drawbacks. In particular, creating a clock tree from scratch can take a long time, and can drastically change the clock tree structure, both of which are undesirable. In contrast to such conventional clock tree synthesis approaches, some embodiments described herein can build a clock tree in an incremental fashion.

Figure 4:
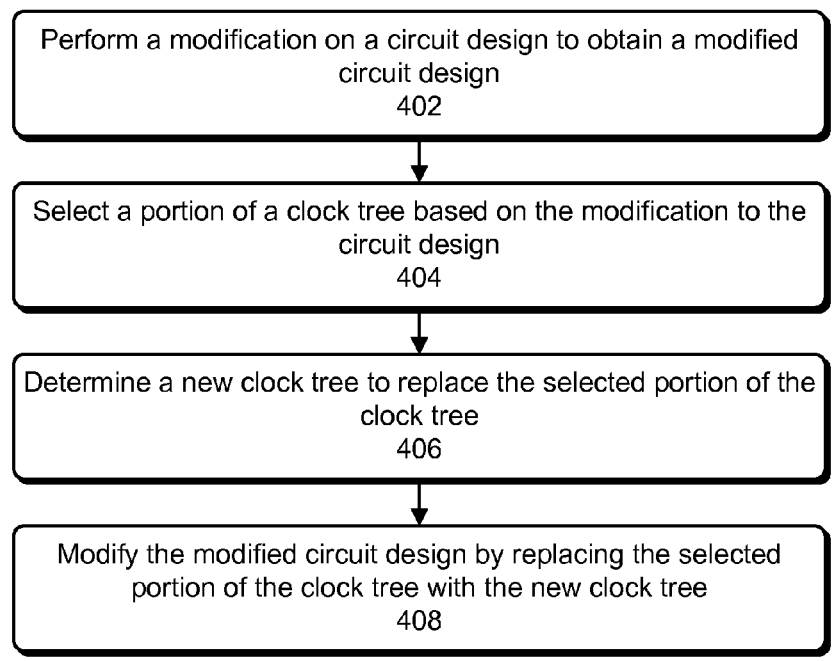
FIG. 4 presents a flowchart that illustrates a process for incrementally synthesizing a clock tree in accordance with some embodiments described herein.

FIG. 4 presents a flowchart that illustrates a process for incrementally synthesizing a clock tree in accordance with some embodiments described herein. The process can begin with performing a modification on a circuit design to obtain a modified circuit design (operation 402). For example, during logical and/or physical synthesis, a part of the circuit design may be modified (e.g., to optimize timing, area, or leakage power). As another example, an engineering change order (ECO) may be applied to a circuit design. According to one definition, an ECO is a modification that is made to a circuit design outside of the normal EDA design flow. An example of an ECO is a manual modification of the circuit design for a specific purpose, e.g., to fix a timing violation or a design rule check (DRC) violation.

Next, a portion of a clock tree in the circuit design can be selected based on the modification to the circuit design (operation 404). Specifically, selecting the portion of the clock tree can involve determining the portion of the clock tree that distributes a clock signal to sequential circuit elements in the portion of the circuit design that was modified.

Once the portion of the clock tree has been selected, a new clock tree can be determined to replace the selected portion of the clock tree (operation 406), and the modified circuit design can then be further modified by replacing the selected portion of the clock tree with the new clock tree (operation 408). Note that it is not necessary to determine the new clock tree in its entirety before replacing the selected portion of the clock tree with the new clock tree. In other words, operations 406 and 408 can be performed concurrently. For example, buffers and/or nets in the selected portion of the clock tree can be replaced by new buffers and/or nets as each new buffer and/or net is determined.

Figure 5A:
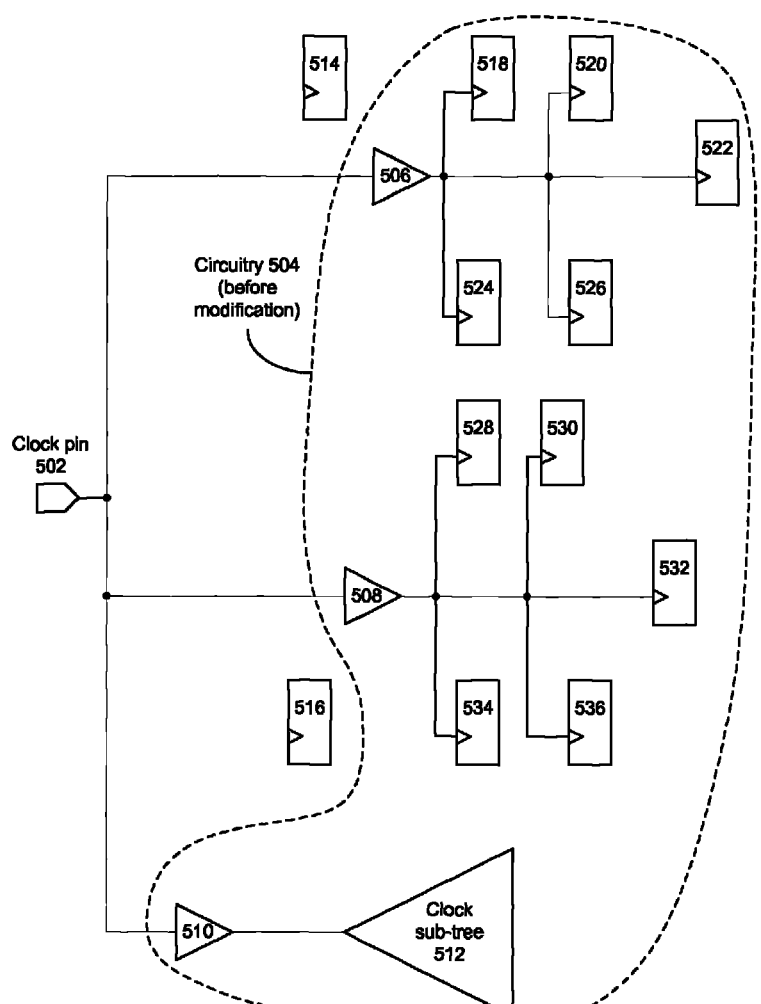
FIGS. 5A-5D illustrate an example of incremental clock tree synthesis in accordance with some embodiments described herein.

FIGS. 5A-5D illustrate an example of incremental clock tree synthesis in accordance with some embodiments described herein. Circuitry 504 in FIG. 5A represents the circuit elements before the circuit design is modified (e.g., before operation 402). Sequential circuit elements 514 and 516 are added to the circuit design as a result of the modification (e.g., as a result of operation 402). For example, sequential circuit elements 514 and 516 may be added to the circuit design when one or more ECOs are applied to the circuit design.

The clock signal from clock pin 502 is distributed through the clock tree to sequential circuit elements 518-536. The clock tree includes buffers 506-510 which are located in the clock tree as shown in FIG. 5A. Buffer 506 provides the clock signal to sequential circuit elements 518-526, buffer 508 provides the clock signal to sequential circuit elements 528-536, and buffer 510 distributes the clock signal to other sequential circuit elements (not shown) through clock sub-tree 512.

Figure 5B:
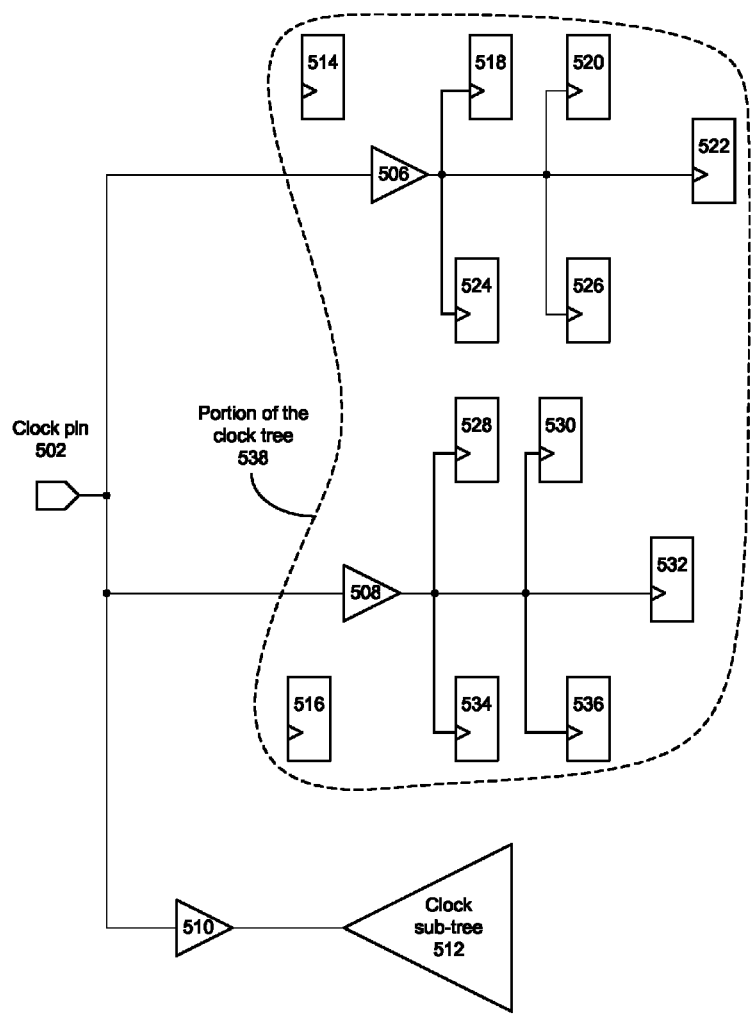

FIG. 5B illustrates how a portion of the clock tree can be selected based on the modification to the circuit design. Specifically, some embodiments described herein select a portion of the clock tree that is in logical and/or physical proximity to the modifications that were made to the circuit design. For example, portion of the clock tree 538 can be selected in response to determining that sequential circuit elements 514 and 516 were added to the circuit design. Note that buffer 510 and clock sub-tree 512 was not selected because they are not in logical or physical proximity to the sequential circuit elements 514 and 516.

Figure 5C:
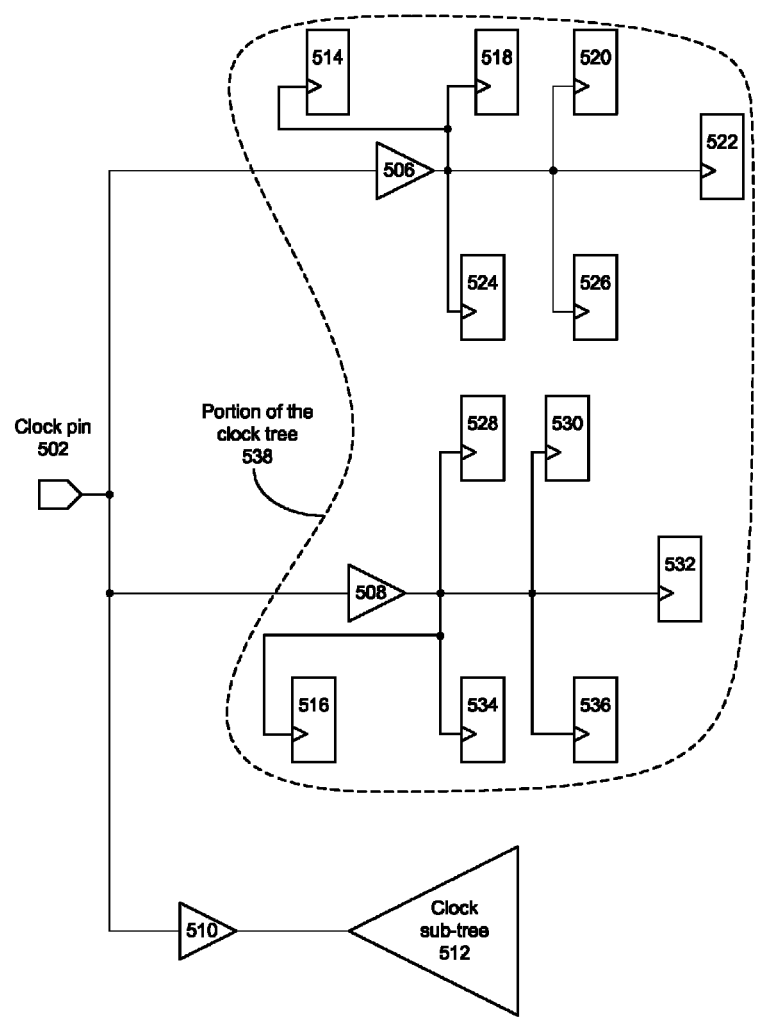

Once the portion of the clock tree is selected, a new clock tree can be determined to replace the selected portion of the clock tree. In some embodiments, determining the new clock tree and replacing the selected portion of the clock tree with the new clock tree can be performed as follows. First, as shown in FIG. 5C, the selected portion of the clock tree can be extended (e.g., by adding new wires to existing nets) to provide a clock signal to the newly added sequential circuit elements 514 and 516. If the extended clock tree is satisfactory (e.g., satisfies the various constraints), then the extended clock tree can be outputted as the incrementally synthesized clock tree. On the other hand, if the extended clock tree is not satisfactory, the selected portion of the clock tree can be optimized (in some embodiments, the selected portion of the clock tree may be optimized by default without first creating an extended clock tree and checking whether the extended clock tree is satisfactory).

Figure 5D:
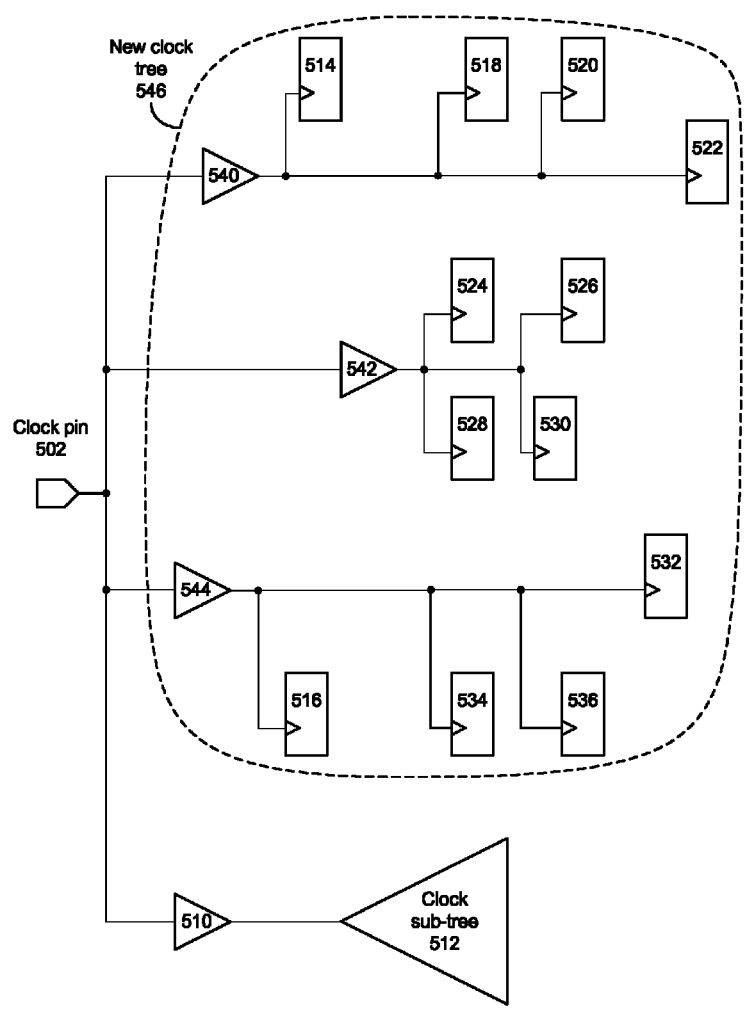

Specifically, the selected portion of the clock tree 538 can be incrementally optimized by ripping up the selected portion of the clock tree 538 (e.g., by removing the buffers and the nets in the selected portion of the clock tree 538), and rebuilding the ripped-up portion of the clock tree. For example, the selected portion of the clock tree 538 can be ripped up, and a new optimized clock tree can be constructed as shown in FIG. 5D. Specifically, new clock tree 546 shown in FIG. 5D is an optimized clock tree that can replace the selected portion of clock tree 538 in FIG. 5C. New clock tree 546 includes buffers 540-544 (note that these buffers have different locations than buffers 504-508, and they provide the clock signal to different sets of sequential circuit elements). Buffer 540 provides the clock signal to sequential circuit elements 514 and 518-522, buffer 542 provides the clock signal to sequential circuit elements 524-530, and buffer 544 provides the clock signal to sequential circuit elements 516 and 532-536.

Computer System

Figure 6:
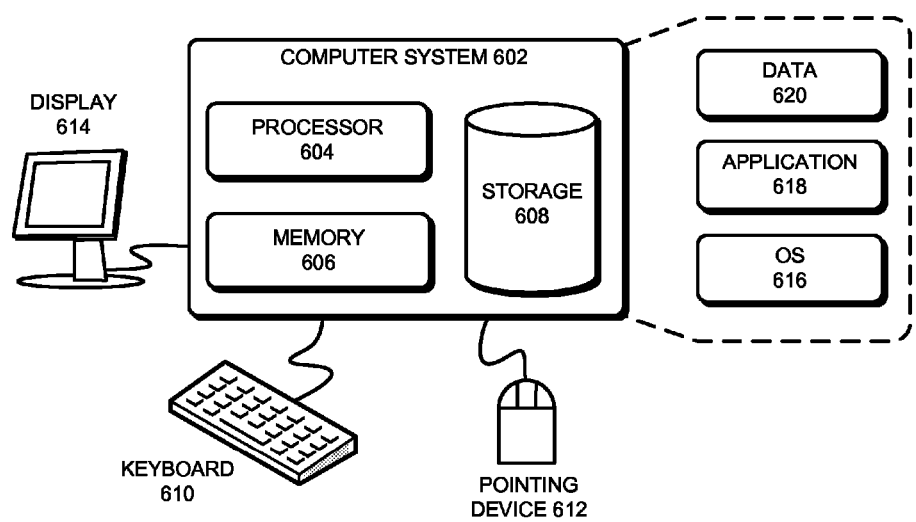
FIG. 6 illustrates a computer system in accordance with some embodiments described in this disclosure.

FIG. 6 illustrates a computer system in accordance with some embodiments described in this disclosure. Computer system 602 can include processor 604, memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618.

Computer system 602 may automatically (or with user intervention) perform one or more operations that are implicitly or explicitly described in this disclosure. Specifically, during operation, computer system 602 can load application 618 into memory 606. Application 618 can then be used to synthesize a clock tree that substantially minimizes local clock skew and/or incrementally synthesize a clock tree.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for synthesizing a clock tree for a circuit design, the method comprising:
partitioning, by using one or more computers, the circuit design into clock skew groups based on direct and transitive timing relationships between sequential circuit elements in the circuit design; and for each clock skew group,
building an initial clock tree such that worst case clock skew in the clock skew group is substantially minimized, and
optimizing the initial clock tree by substantially minimizing worst case local clock skew in the clock skew group.

2. The method of claim 1, wherein all pairs of sequential circuit elements in a clock skew group have a direct or a transitive timing relationship between each other, and wherein two sequential circuit elements in two different clock skew groups do not have a direct or a transitive timing relationship between each other.

3. The method of claim 1, wherein the worst case clock skew in the clock skew group is computed over all pairs of sequential circuit elements in the clock skew group, and wherein the worst case local clock skew in the clock skew group is computed over all pairs of sequential circuit elements in the clock skew group that have a direct timing relationship between each other.

4. The method of claim 1, further comprising reporting the worst case local clock skew for each clock skew group.

5. A non-transitory computer-readable storage medium storing instructions that, when executed by a computer, cause the computer to perform a method for synthesizing a clock tree for a circuit design, the method comprising:

partitioning the circuit design into clock skew groups based on direct and transitive timing relationships between sequential circuit elements in the circuit design; and for each clock skew group,
building an initial clock tree such that worst case clock skew in the clock skew group is substantially minimized, and
optimizing the initial clock tree by substantially minimizing worst case local clock skew in the clock skew group.

6. The non-transitory computer-readable storage medium of claim 5, wherein all pairs of sequential circuit elements in a clock skew group have a direct or a transitive timing relationship between each other, and wherein two sequential circuit elements in two different clock skew groups do not have a direct or a transitive timing relationship between each other.

7. The non-transitory computer-readable storage medium of claim 5, wherein the worst case clock skew in the clock skew group is computed over all pairs of sequential circuit elements in the clock skew group, and wherein the worst case local clock skew in the clock skew group is computed over all pairs of sequential circuit elements in the clock skew group that have a direct timing relationship between each other.

8. The non-transitory computer-readable storage medium of claim 5, wherein the method further comprises reporting the worst case local clock skew for each clock skew group.

9. An apparatus, comprising:
a processor; and
a non-transitory computer-readable storage medium storing instructions that, when executed by the processor, cause the apparatus to perform a method for synthesizing a clock tree for a circuit design, the method comprising:

partitioning the circuit design into clock skew groups based on direct and transitive timing relationships between sequential circuit elements in the circuit design; and for each clock skew group,
building an initial clock tree such that worst case clock skew in the clock skew group is substantially minimized, and
optimizing the initial clock tree by substantially minimizing worst case local clock skew in the clock skew group.

10. The apparatus of claim 9, wherein all pairs of sequential circuit elements in a clock skew group have a direct or a transitive timing relationship between each other, and wherein two sequential circuit elements in two different clock skew groups do not have a direct or a transitive timing relationship between each other.

11. The apparatus of claim 9, wherein the worst case clock skew in the clock skew group is computed over all pairs of sequential circuit elements in the clock skew group, and wherein the worst case local clock skew in the clock skew group is computed over all pairs of sequential circuit elements in the clock skew group that have a direct timing relationship between each other.

12. The apparatus of claim 9, wherein the method performed by the apparatus further comprises reporting the worst case local clock skew for each clock skew group.

* * * * *